United States Patent [19]
Tamhankar et al.

[11] Patent Number: 5,230,846
[45] Date of Patent: Jul. 27, 1993

[54] METHOD FOR PREPARING MULTILAYERED CERAMIC WITH INTERNAL COPPER CONDUCTOR

[75] Inventors: Satish S. Tamhankar, Scotch Plains; Mark J. Kirschner, Morristown, both of N.J.

[73] Assignee: The BOC Group, Inc., New Providence, N.J.

[21] Appl. No.: 754,347

[22] Filed: Sep. 5, 1991

Related U.S. Application Data

[63] Continuation of Ser. No. 596,122, Oct. 11, 1990, abandoned.

[51] Int. Cl.$^5$ ............................................. C04B 37/00
[52] U.S. Cl. ......................................... 264/61; 264/65; 264/66
[58] Field of Search ................. 264/61, 65, 66; 156/89

[56] References Cited

U.S. PATENT DOCUMENTS

| | | | |
|---|---|---|---|
| 3,852,877 | 12/1974 | Ahn et al. | 29/625 |
| 4,661,315 | 4/1987 | Wiech, Jr. | 419/10 |
| 4,906,405 | 3/1990 | Nakatani | 252/518 |
| 4,915,899 | 4/1990 | Oliver et al. | 419/8 |

FOREIGN PATENT DOCUMENTS

164841 12/1985 United Kingdom.
326499 8/1989 United Kingdom.

*Primary Examiner*—Jan H. Silbaugh
*Assistant Examiner*—Christopher A. Fiorilla
*Attorney, Agent, or Firm*—David M. Rosenblum; Larry R. Cassett

[57] ABSTRACT

A method for heat processing of multilayered ceramic articles containing internal conductive metal patterns that have been formed from multiple ceramic green sheets individually coated with inks or pastes containing conductor metal/metal oxide material, and thereafter assembled in registry with each other and laminated. The heat treating method to convert the laminate to the final ceramic article includes a first heating stage under conditions to promote burn-out of the organic polymeric binder present, a second stage performed under conditions to reduce the metallic conductor, and a third stage to sinter the multilayered composite to form the final ceramic article. The invention is characterized by the presence of moisture in an amount of from about 0.5% to about 3% of the gaseous atmosphere in at least the sintering stage, and preferably at both the binder burnout stage and the sintering stage. Multilayered articles heat treated under these conditions exhibit a combination of improved properties, including little or no staining in combination with improved conductivity and dielectric properties. In a preferred embodiment, the present method may be performed as a continuous process without the need for cool-down and heat-up of the laminate, in a continuous furnace with an atmosphere that is microprocessor-controlled. Optional catalytic generation of the moisture containing heating atmosphere may be utilized to further reduce cost and processing time while increasing process efficiency and productivity.

16 Claims, 4 Drawing Sheets

METHOD FOR PREPARING MULTILAYERED CERAMIC WITH INTERNAL COPPER CONDUCTOR

This is a continuation of application Ser. No. 07/596,122, filed Oct. 11, 1990 now abandoned.

The present invention relates to a method for preparing a ceramic circuit having an internal conductor, and, more particularly, to the preparation of such multilayered circuit by the assembly, lamination and firing of a plurality of green ceramic sheets or tapes having disposed thereon conductive pathways defined by copper or copper-containing materials and which exhibit a combination of improved conductivity with little or no staining.

BACKGROUND OF THE INVENTION

The preparation of multilayered ceramic hybrid circuits is well-known. Such composites are in extensive use in the semiconductor industry for the fabrication of, for example, substrate carriers for the mounting of semiconductor or integrated circuit chips, laminated ceramic capacitors, or the like. These products have been traditionally produced by either a thick film printing method, or by what is known as a green sheet lamination method.

The thick film printing method comprises the formulation of a multilayered structure based upon a fired ceramic base. The multilayered structure is achieved by the sequential screen printing of conductor and insulator inks comprised, respectively, of metal or metal oxide powders and ceramic powders, usually formulated in an organic polymeric binder. These coatings are selectively applied in consecutive fashion. This method suffers from the drawbacks that repetitive applications of the insulator or dielectric material must be applied to achieve each layer and the resulting substrate must be fired after each printing process. The extensive cycling of such a method adds undesired time and expense to fabrication and the ultimate cost of the product. It is moreover noted that the thick film printing method is limited in the density that can be achieved with interconnect circuitry, and is likewise prone to low production yields. Other drawbacks include ceramic layer hermeticity that results directly from the use of screen printing methods to form the various layers, and the inability of the bonding agents conventionally employed in metal pastes to function acceptably in the nitrogen firing applications that are required to avoid undesired oxidation of the conductor metal.

The green sheet lamination method comprises the printing of desired metal circuits on individual green ceramic sheets, which sheets are then stacked and successively laminated and thereafter co-fired to form a monolithic interconnect structure or package. This method generally may commence with the preparation of the ceramic green tape by, for example, a doctor blade casting process from a slurry containing a mixture of ceramic powders, thermoplastic resin, solvents, and other additives, such as dispersants and plasticizers. Vinyl polymers such as polyvinylbutyral (PVB) are commonly used in the resin system for the formation of the tape. After formation, the green tape is then blanked into sheets and registration holes are punched. Via holes which serve as vertical interconnects between layers in the final package may be punched using fixed tooling or corresponding adjustable equipment. The holes are then filled and circuit trace patterns are printed using the desired metallization compositions. After the individual sheets are prepared, they are stacked in the proper sequence and laminated to form the composite laminate. The laminate is then fired to decompose and remove the organic binder and to sinter the ceramic and metal particles, to thereby form the dense body containing the desired three-dimensional wiring pattern.

The preparation of multilayered ceramic circuit structures involving the green sheet method is extensively treated in the patent literature. Thus, U.S. Pat. No. 3,770,529 to Anderson discloses the preparation of such structures and specifically relates to the machining of the green sheets by radiation beams. U.S. Pat. No. 3,852,877 to Ahn et al. is specifically directed to a metallizing coating of specific composition. U.S. Pat. No. 4,861,646 to Barringer et al. discloses a particular glass ceramic composition binder system and metal "ink" for the preparation of improved green sheets. U.S. Pat. No. 4,871,608 to Kondo et al. relates to a particular conductor paste which includes copper/copper oxide and one of $MnO_2$ and $Ag_2O$ to limit thermal contraction of the conductor paste during firing.

Of the stages involved in the fabrication of multilayered ceramic substrates, attention has focused on the heating of the laminated structure to form the final sintered article. As can be appreciated, the heating procedure seeks to achieve distinct objectives, among them complete burn-out of the organic polymeric binder without the retention of carbonaceous residues or undesired porosity in the final article, and unwanted oxidation or reduction of the ceramic and metal components of the composite. The difficulty in the coordination of the heating program has been the balancing of the need for sufficient oxidation to remove the binder completely with the need for either a neutral or reducing atmosphere, as the case may be, to maintain or convert to the metallic state, the conductive material while retaining the oxidic state of the surrounding ceramic materials during high temperature baking and sintering.

The following patents are noted for their relevance to the heat treatment of multilayered ceramic circuits prepared with ceramic green sheets. Thus, U.S. Pat. No. 4,153,491 to Swiss et al. accelerates sintering of a multilayered ceramic hybrid circuit by eliminating a separate binder burn-off step. The patentees appear to rely on a ceramic green sheet based on high alumina content particles having average particle sizes greater than one micron, and close particle size distribution.

U.S. Pat. No. 4,877,555 to Yuhaku et al. discloses a conductor paste that comprises CuO as a main inorganic component, with an additive selected from $Cu_2O$ and CuO. Yuhaku et al. teach the preparation of their multilayer structure by the disposition of their conductor paste and a dielectric paste in a predetermined sequence, followed by the heat treatment of the resulting structure, first to remove the binder, then to metallize the internal conductor and lastly, to fire the final product. The first heat treatment is performed in air, the metallization is performed in a reducing atmosphere, and the firing step is performed in a neutral atmosphere. The Yuhaku et al. disclosure seeks to control shrinkage and expansion of the copper conductor by varying the amounts of the above-noted inorganic components. The Yuhaku et al. invention is purported to permit the use of a relatively thin conductor layer and dielectric layer in the preparation of the composite therein. This result is desired in the instance of small-sized large capacitance capacitors.

In U.S. Pat. No. 4,863,683 to Nakatani et al., a method for preparing a multilayer conductor is disclosed where the conductor metals are provided as oxides which are converted to the metallic state during heating. Nakatani et al. first heat the composite to burn out the binder, and then heat the body in a reducing atmosphere to reduce the metal oxides. Both the binder burn-out and reduction heating steps are performed at temperatures below the sintering temperature of the glass or ceramic components of the insulating paste, to encourage conversion of the metal oxides of the conductor layers to the metallic state. Thereafter, the body is heated in a neutral atmosphere such as nitrogen to sinter the body to form the final multilayered article. Nakatani et al. are similar to Yuhaku et al. in their general use of a three-stage heating schedule, although they differ as to the compositions of their conductor pastes and the details of their heating steps.

U.S. Pat. No. 4,234,367 to Herron et al. employs an atmosphere of $H_2$ and $H_2O$ at temperatures below the melting point of copper, i.e., of up to about $785° \pm 10°$ C. Sintering, however, is conducted in an inert atmosphere such as $N_2$, and $H_2O$ is not present. U.S. Pat. No. 4,504,339 to Kamehara et al. is similar to Herron et al. in that water vapor is included in the binder burn-off atmosphere. In Kamehara et al., water vapor is expressly excluded from the firing or sintering atmosphere, to avoid oxidation of the conductive copper pattern. Finally, U.S. Pat. No. 4,891,246 to McEwen et al. relates to the use of a firing atmosphere that includes $CO/CO_2$ and water in combination, and distinguishes the use of $H_2O$ alone. McEwen et al. is particularly noteworthy for its review of the prior art, which review is incorporated herein by reference.

From the above review and as particularly set forth in Yuhaku et al. and Nakatani et al., the heating program for these multilayered ceramic structures has generally been conducted in three stages, as follows: a first binder burn-out stage; a second reducing stage; and a third firing or sintering stage.

An additional concern that has been noted and is not addressed in the prior art, however, has to do with the staining of the ceramic phase of the structure by copper inclusions. More particularly, ionic copper is believed to diffuse into the ceramic/glass phase of the composite during binder burn-out and the early part of the sintering step, and during sintering, is believed to be reduced to a lower oxidation state which exhibits the characteristic purple or pink color of the metal. This reduction is believed to occur as a result of the low oxidation potential of the nitrogen atmosphere present during the sintering step.

As the bulk of the copper needs to be protected from oxidation at this stage, the addition of oxygen is generally avoided. Thus, the modulation of the composition of the firing atmosphere to achieve the desired combination of properties is further complicated by the unacceptable appearance that results from the unwanted diffusion of copper. A need therefore exists to reduce or eliminate staining of the composite article while maintaining or improving product integrity, conductivity and other desirable performance properties thereof.

SUMMARY OF THE INVENTION

In accordance with the invention, a method for heat treating multilayered ceramic articles prepared from a plurality of ceramic green sheets including a volatizable organic binder, and bearing conductive metal/metal oxide patterns printed thereon, comprises a three-stage heating schedule, with a first oxidizing atmosphere for binder burn-out, a second reducing atmosphere to convert all of the conductor to the metallic state, and a third sintering step to form the final fired article, wherein the firing atmosphere for at least the third stage contains from about 0.5% to about 3.0% moisture ($H_2O$) and preferably from about 1% to about 2% moisture, with the concentration of moisture maintained at or about 2% during sintering. Preferably, moisture may be present in the heating atmosphere of the first and third stages, and most preferably at all three stages of the heating process, within the above ranges.

In addition to reducing or eliminating staining, the present method achieves improved binder burn-out and enhances the extent of reduction when moisture is included in the reducing stage. The resulting composite exhibits greater integrity, reduced porosity and correspondingly improved conductivity and dielectric properties. Moreover, the atmospheric requirements of the present process are less stringent, as, for example, as little as 1% $O_2$ may be added to the binder burn-out atmosphere when moisture is present, with satisfactory results for certain applications.

The present method may be performed on a continuous basis and can thereby be practiced in as little as 24 hours or less, which is a substantial reduction in processing time over that achieved in the prior art. The continuous practice of the present method contemplates the residence of the composite within a single furnace which might either be a box-type furnace with a programmed atmosphere or a belt-type furnace with curtains disposed between the various sections of the furnace where changes in the heating atmosphere would be made. The heating atmosphere in a continuous processing environment of this kind would utilize a primary component of moist nitrogen. The transition from a binder burn-out atmosphere to a reducing atmosphere could be accomplished by the initial introduction of a quantity of oxygen which, as mentioned earlier, could be as little as 1%, followed by a transition to hydrogen at the termination of the binder burn-out stage and the commencement of the reduction stage.

Preferably, the transition from binder burn-out to reducing atmosphere could be achieved by the generation of moisture with a catalytic humidifier. In such instance, the operation of the humidifier could be modulated first, to provide the additional oxygen required for binder burn-out, and thereafter, to offer additional hydrogen for the reducing stage. A representative catalytic humidifier is disclosed in U.S. Pat. No. 3,630,956 to Benning et al., the disclosure of which is incorporated herein by reference. Other comparable gas generating means are contemplated and are includeable herein.

The present invention may be further considered from a review of the ensuing detailed description which proceeds with reference to the following illustrative drawings.

DETAILED DESCRIPTION

In its broadest aspect, the present invention relates to the heat treatment of multilayered ceramic/glass composites formed from ceramic green sheets, which glass composites bear internal copper conductor patterns derived from the printing of copper/copper oxide-containing printing pastes on individual layers of the composite. The composites themselves are well-known and the compositions of the green sheets and the copper conductor pastes are likewise well-documented in the art. The primary aspect of the present invention relates to the parameters that attend the heat treatment of the laminated composite to form the final multilayered ceramic article.

As mentioned earlier, the formation of such multilayered ceramic articles has required careful process controls to optimize the properties of the resulting composite. The prior art discussed above is replete with reference to the undesirable consequences of excessive oxidation or reduction of the composite article during binder burn-out and sintering. Thus, excessive oxidation can result in unwanted oxidation of the conductor metal and concomitant reductions in conductivity and dielectric properties, while insufficient oxidation will result in the retention of carbonaceous residues which will cause voids to form in the final article, thereby detracting from its structural integrity and consequent utility as an electrical device. In addition to the concerns noted in the prior art with respect to binder burn-out and control of conductor oxidation/reduction, Applicants have noted a further concern in the occurrence of unwanted ceramic staining apparently caused by unwanted diffusion of copper into the ceramic or glass phase during heat processing. As mentioned earlier, Applicants theorize that copper diffuses into the glass phase during binder burn-out as well as upon the commencement of sintering, and forms the unwanted stain as the former is reduced to a lower oxidation state. Such stains are commercially unacceptable, however, their control heretofore has gone uncorrected and, for that matter, has never been formally addressed in the art.

In this context, the present invention is made all the more distinctive, in that Applicants have noted the drawbacks of copper-induced staining and have addressed this problem favorably by the development of the present heat treatment method. In accordance with this method, a quantity of moisture is introduced at least, at the sintering stage, and preferably at both the binder burn-out and sintering stages of a three-stage heat treatment, whereupon staining is substantially reduced or eliminated. Most preferably, moisture may be present in the burn-out, reducing and sintering stages, whereupon optimal properties, including improved conductivity and dielectric properties and the absence of staining will be attained.

The concentration of moisture during the present heat treatment may be maintained at an amount ranging from about 0.5% to about 3%, balance being the primary or purge gas of the heating atmosphere, and preferably may be from about 1% to about 2% with a most preferred range on or about 2% during the sintering stage. The temperature ranges employed in the heat treatment may be otherwise as known in the art, and, for example, the binder burn-out stage may be conducted up to a temperature of about 500° C., the reduction heating stage may also be conducted at a temperature up to about 500° C. and the sintering or firing stage may be conducted at temperatures of up to about 920.C. Naturally, the foregoing temperature parameters are exemplary only, as variations in these temperature levels may be made in accordance with such factors as the exact composition of the green sheet and conductor paste compositions and the particular heating apparatus or system in use.

One of the aspects of the present invention that makes it particularly advantageous is the ability to conduct binder burn-out effectively and completely while, at the same time, reducing oxygen requirements. This is considered particularly noteworthy in view of the fact that the multilayered composite has traditionally required additional oxygen or other oxidizing elements in the burn-out atmosphere due to its multilayered configuration, and that such additional oxidizing elements have generally resulted in unwanted oxidation of the conductor metal. In the present instance, the use of moisture within the ranges hereinbefore specified facilitates the presence of from about 2% to about 20% of oxygen in the burn-out atmosphere, preferably from about 2% to about 5%, and in some instances, as little as 1%. This is clearly distinguishable from the burn-out atmospheres shown in the prior art illustrated herein, which generally utilize at least 21% oxygen, particularly in the instance where air is used as the primary or purge gas. The reduction in oxygen carries with it a corresponding economy in that oxygen consumption is substantially reduced.

Figure 1:
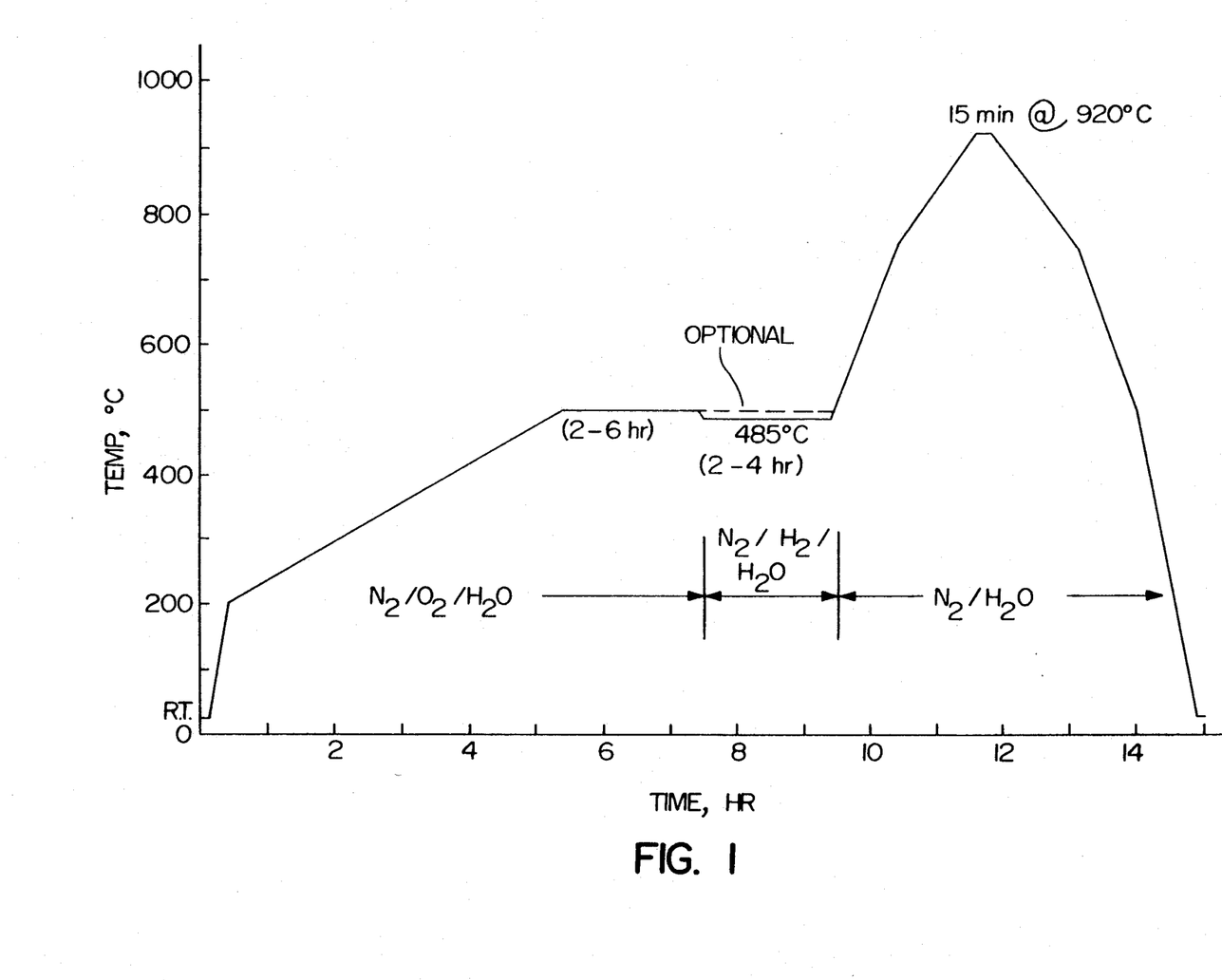
FIG. 1 is a graph illustrating the heating process of the present invention when practiced in continuous fashion, including temperature and atmospheric parameters.

A representative scheme for the present invention is illustrated in FIG. 1, wherein the parameters of a continuous process are graphically depicted. The continuous process contemplates the use of a primary or purge gas of wet nitrogen, which would be varied during the course of the present method by the initial introduction of oxygen in amounts of from about 2% to about 20% as indicated, and preferably, in an amount of from about 2% to about 5%, followed by the transition into the reduction stage, wherein the atmosphere would be modified by the curtailment of oxygen introduction and the commencement of introduction of hydrogen in an amount ranging from about 1% to about 10%, and preferably, from about 1% to about 5%. After the completion of the reduction stage, the sintering stage could then commence, wherein the nitrogen based purge gas as supplemented with moisture, would be maintained. Preferably, the amount of moisture present in the sintering atmosphere of the third stage should be at or about 2%. Naturally, the foregoing parameters may be modified somewhat, in the instance where the main gas is air or another acceptable primary ambient, it being understood that the inclusion of moisture during at least the sintering stage, and preferably during both the burn-out and sintering stages of the present method, and within the general ranges set forth herein, is maintained.

Figure 2:
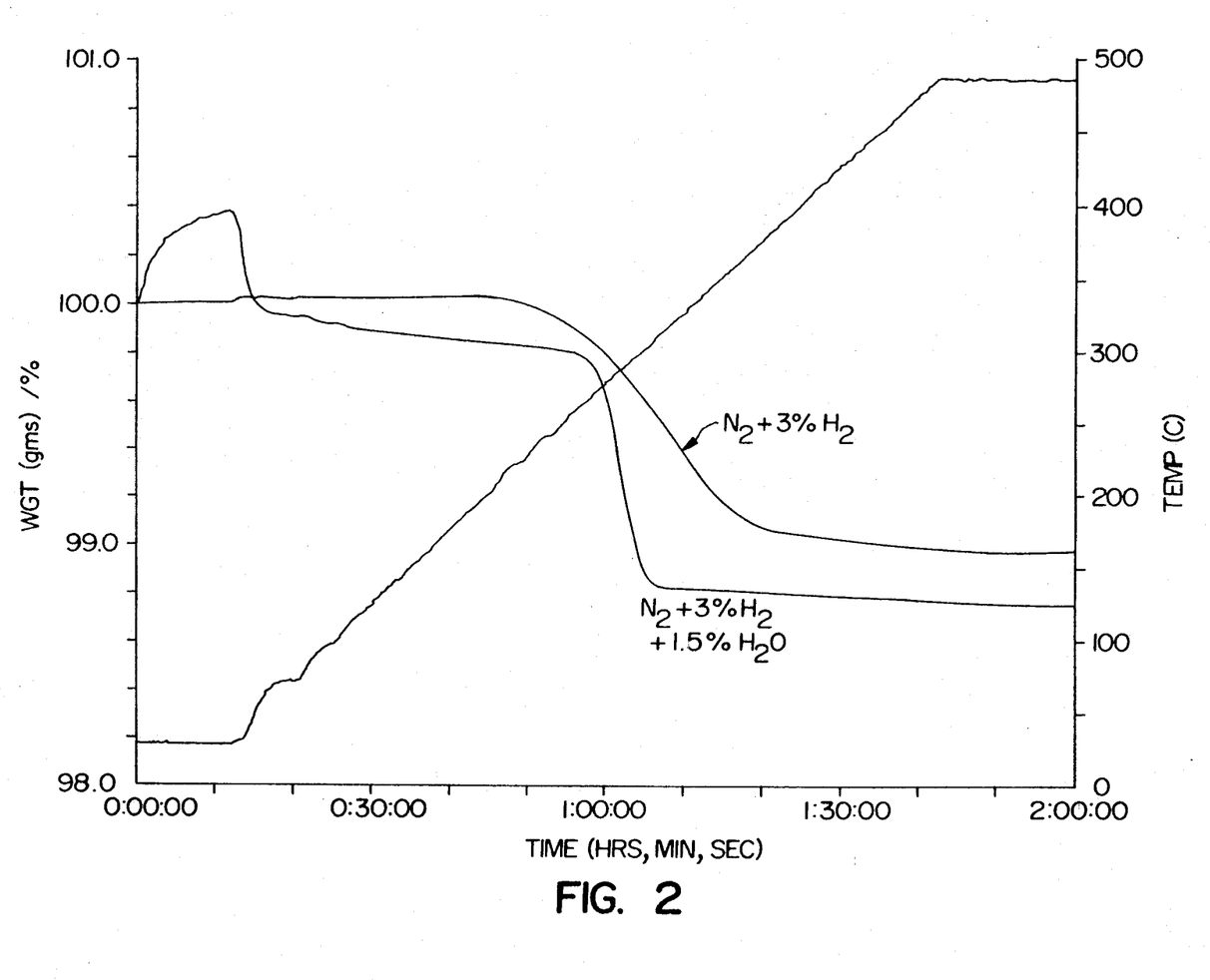
FIG. 2 is a graph illustrating the increased rate of reduction of the reduction heating stage of the present invention as compared with the known reduction step wherein moisture is not present.

The present method is likewise distinguishable in its performance during the reduction stage, as unexpected improvements in the rate of reduction are achieved herein. Inasmuch as the presence of moisture has been traditionally considered as an oxidizing influence rather than a reducing influence, the acceleration in the rate of reduction that is achieved herein is noteworthy. Thus, and referring to FIG. 2 herein, the rate of reduction achieved with the present atmosphere is compared with that achieved with an atmosphere containing nitrogen and hydrogen alone, and it can be seen that reduction is achieved over a shorter period of time when moisture is present in the amounts set forth herein.

An interesting comparison, however, can be made between the present invention as it relates to multilayered ceramic articles and the use of similar parameters in a reducing atmosphere for a single layered conductive ceramic article. Specifically, and with reference to FIG. 3, a single pre-fired alumina substrate was coated with a copper/copper oxide paste which was then heat treated in a reducing atmosphere identical to the respective atmospheres compared in FIG. 2. That is, a first reducing atmosphere employing nitrogen with a quantity of hydrogen and a second reducing atmosphere including, in addition thereto, a quantity of moisture, were compared with identical single-coated substrates, distinctive in the exposed disposition of the copper conductor paste.

Figure 3:
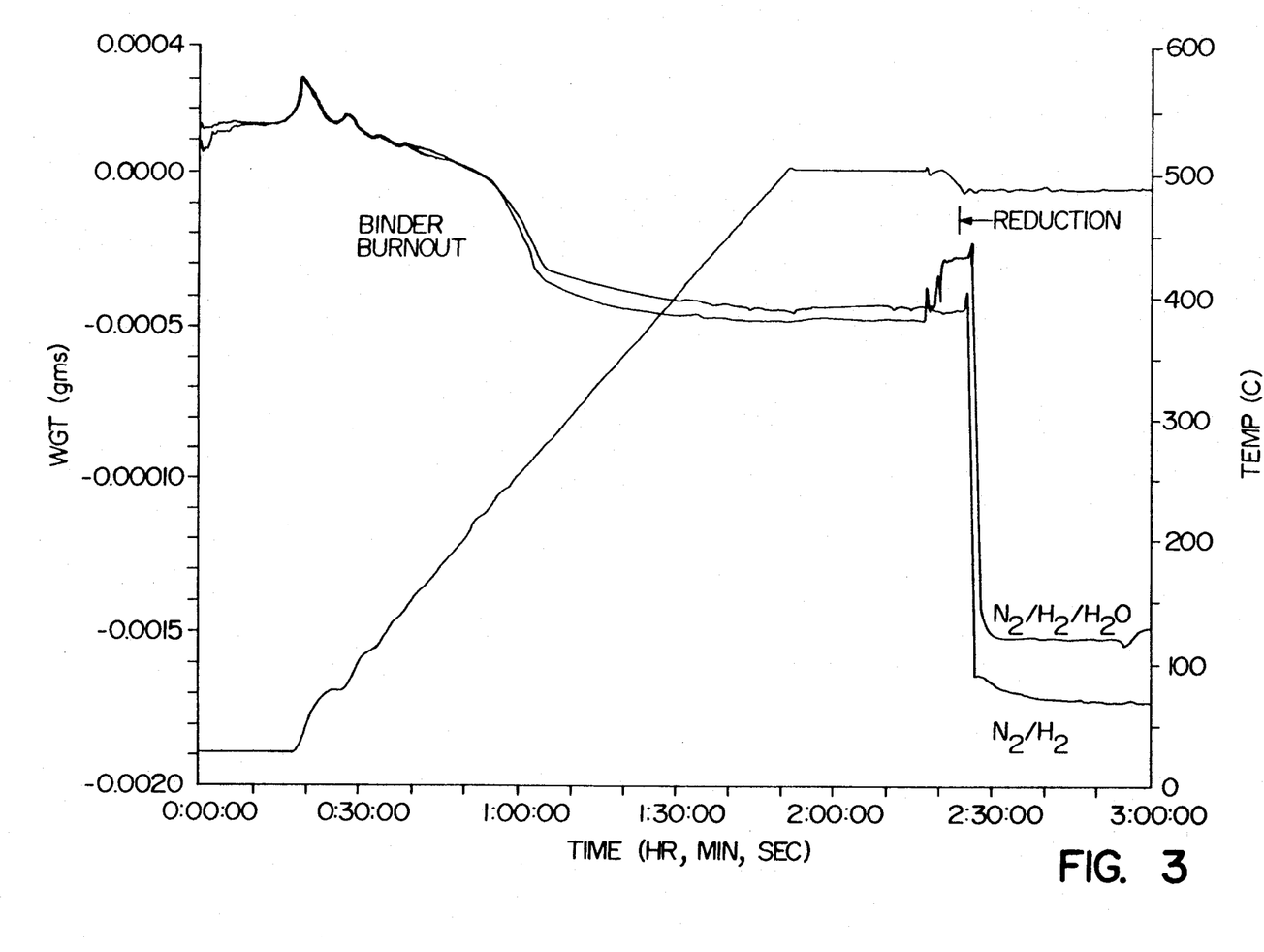
FIG. 3 is a graph illustrating the results of a comparison similar to that of FIG. 2 derived from the heating of a copper/copper oxide paste disposed on a pre-fired alumina substrate which is directly exposed to the atmosphere.

In this latter instance, the rate of reduction in the atmosphere containing moisture was comparable to that of the atmosphere wherein moisture was absent. This suggests that a unique phenomenon takes place in the situation where the conductor paste or like material is disposed within the ceramic matrix as it is in a laminated multilayered green article. The behavior of the copper conductor paste in the circumstance where it is disposed within the multilayered composite serves to further distinguish the present invention and to highlight its advantages.

Figure 4:
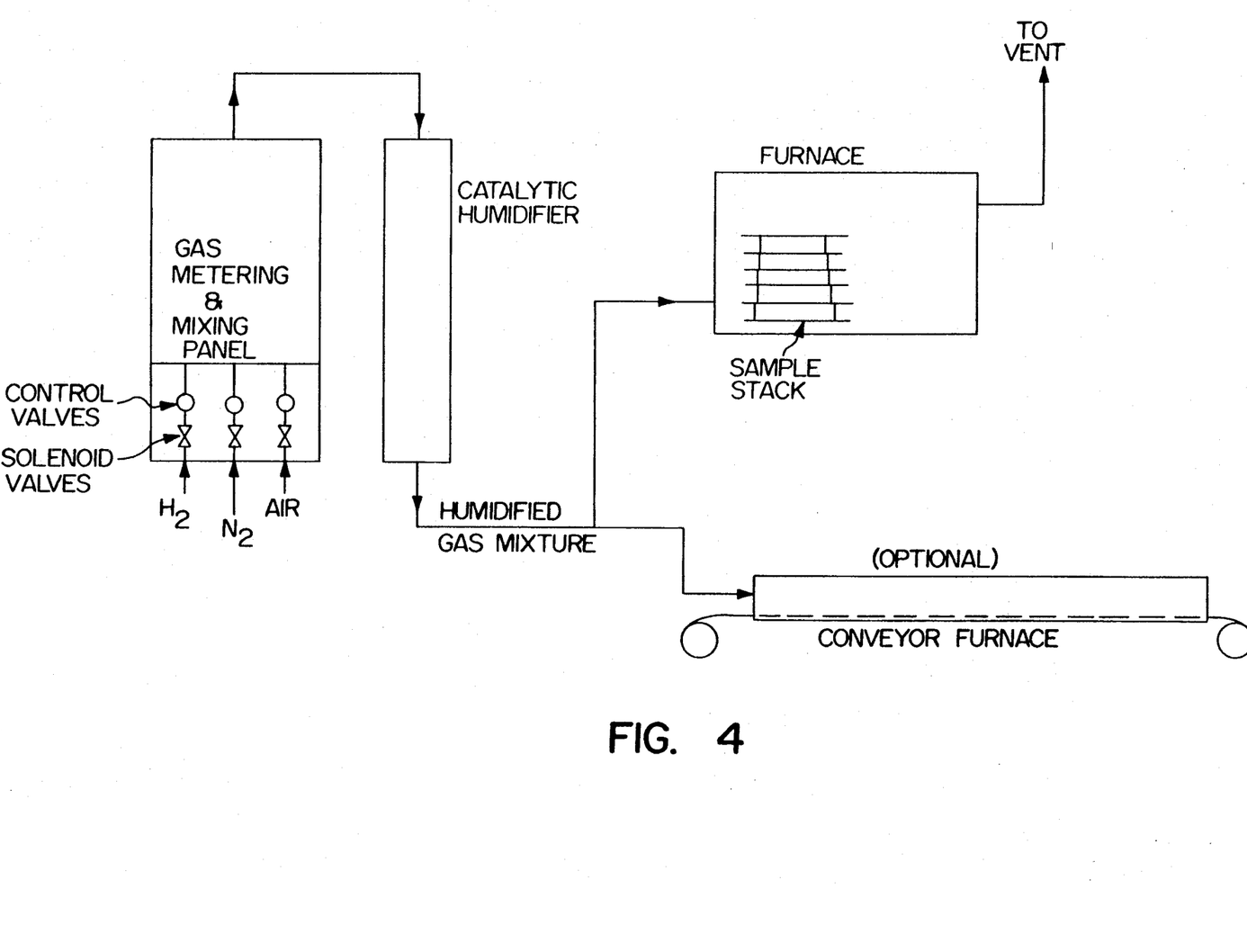
FIG. 4 is a flow diagram illustrating a representative system for the performance of the present method.

Referring again to FIG. 1 and also to FIG. 4, the present invention may be practiced as a continuous process to reduce the overall time requirements of the process and to offer corresponding economies of processing. It can be seen from FIG. 1 that the transition from binder burn-out to reduction, and from reduction to sintering, can be achieved without the need for the cooling of the composite and the subsequent heating up thereof that would be necessary in the instance where each stage of heat processing requires a distinctive atmosphere and other attendant conditions that could not be achieved in a single facility. In the present scheme, a main purge gas such as wet nitrogen can be used throughout, and variations in the amount of oxygen during binder burn-out or the amount of hydrogen during subsequent reduction could be made in a single facility, all as illustrated schematically in FIG. 4.

Referring now to FIG. 4, a proposed system is depicted which would include a catalytic humidifier operated in conjunction with, for example, a muffle furnace that is equipped with a programmable heater control. In this instance, the main purge gas as mentioned earlier would be moist nitrogen which could be achieved by either bubbling nitrogen through water or by utilizing a catalytic humidifier such as schematically depicted. During the first binder burn-out step, oxygen at the levels indicated above, would be added to the main gas. At the end of binder burn-out, oxygen flow would be reduced, and upon adjustment of the temperature level for performance of the reduction stage, hydrogen flow within the ranges indicated above would commence. After reduction is complete, the flow of hydrogen is reduced, and an atmosphere comprising wet nitrogen continues as the sole ambient for the remainder of the process. The control of the flow of oxygen and hydrogen could be achieved with solenoid valves which would be programmed for specific time sequences based upon the temperature profile of the process, utilizing, for example, a microprocessor.

As mentioned earlier, the catalytic humidifier that may be used in accordance with the present invention may be similar in construction and operation to that disclosed in Benning et al. U.S. Pat. No. 3,630,956, incorporated earlier herein by reference. Thus, for example, nitrogen may be fed into the reactor vessel containing a noble metal based catalyst, such as palladium, whereupon oxygen and hydrogen would react on the surface of the catalyst to produce water. Such a process may be operated on an automated basis, as mentioned above, and the extent of hydrogen or oxygen introduced may be appropriately varied to achieve the unreacted quantities of each that would be desired, respectively, in the binder burn-out and reduction heating stages.

The preparation of multilayered ceramic circuits is itself known and, for example, proceeds by the preparation of appropriate ceramic tapes or sheets to which are applied conductor patterns by such techniques as screen printing of appropriate copper/copper oxide-containing printable pastes. Generally, the green ceramic tapes or sheets are cut into blanks to the desired size for a particular multilayered article, after which via holes are punched which are consistent with the circuit design. These holes are then filled with the conductor paste by, for example, a contact printing method, after which the desired conductor patterns are screen printed onto the different tape layers. The layers are thereafter stacked together in a die and laminated by applying pressure and temperature within known parameters. The device as prepared is then ready for processing in accordance with the present invention.

Suitable materials for the formation of the multilayered ceramic composites processable in accordance with the present invention are themselves well-known. The green tapes are generally prepared from compositions including various glass and ceramic ingredients, such as, for example, various silicate glasses, alumina, quartz and the like, in mixture with a suitable volatizable organic binder. The binder may be selected from natural or synthetic resins and would include, for example, cellulosic resins such as ethylcellulose, vinyl polymer such as polyvinylbutyral and acrylic and methacrylic polymers and copolymers. Additional ingredients including plasticizers, vehicles and the like are likewise contemplated, and the invention is not accordingly limited to the exact compositions or the ingredients herein.

Likewise, the conductive pastes would include mixtures of copper and copper oxides, with the latter being preponderant. The organic binder for the conductive paste could be the same or similar to the binders employed in the green ceramic tape, and the exact composition thereof may likewise vary in accordance with the present invention.

As mentioned earlier, the present method is predicated upon the presence of moisture at the binder burn-out and sintering stages, to achieve the unexpected reduction in copper diffusion and resultant ceramic staining. Particularly, comparative tests of like composites were made within the scope of the present invention, with heating atmospheres that differed only in the presence or absence of moisture. Such comparison is set forth in Table 1, below.

TABLE 1

| | Staining Characteristics | | | |
|---|---|---|---|---|
| Run No. | Burn-out | Reduction | Sintering | Result |
| 1 | Air/$H_2O$ | $N_2/H_2/H_2O$ | $N_2/H_2O$ | No staining |
| 2 | Air/$H_2O$ | $N_2/H_2/H_2O$ | $N_2$ | Stained |
| 3 | Air | $N_2/H_2$ | $N_2/H_2O$ | Some staining |
| 4 | Air/$H_2O$ | $N_2/H_2$ | $N_2/H_2O$ | No staining |
| 5 | Air | $N_2/H_2/H_2O$ | $N_2/H_2O$ | Some staining |

Referring now to Table 1, it will be noted that the binder burn-out stage in this instance utilized air as the primary ambient, whereas nitrogen was the primary ambient in both the reduction and sintering stages. This illustrates the fact that the present invention may be performed with variation as to the particular primary ambient involved so long as the general character of the atmosphere used at each stage is maintained.

More importantly, a review of Table 1 reveals that no staining was evident in Run Nos. 1 and 4, where moisture was present in both the burn-out and sintering stages.

Mild staining was found in the instance of Run Nos. 3 and 5, where moisture was present either in the sintering stage alone, and in both the sintering and reduction stages, respectively. Clearly, the most significant staining occurred in the instance where moisture was absent from the sintering stage and, for this reason, the present invention in its most essential aspect, comprises the employment of moisture at that last heat processing stage.

Likewise, and as indicated earlier, the present method permits as little as 1% added oxygen during binder burn-out to achieve desirable properties in the resultant fired composite. Thus, and with reference to Table 2, it can be seen that a variety of processing atmospheres may be employed when moisture is present, and even in the instance where the burn-out atmosphere employs a quantity of oxygen of at least 1% concentration, the combination of desirable properties in the resulting composite is optimized.

TABLE 2

| | Effects of Burn-out Atmospheres on Staining | | | |
|---|---|---|---|---|
| Run No. | Burn-out | Reduction | Sintering | Result |
| 6 | $N_2/H_2O$ TO Air/$H_2O$ @400° C. | $N_2/H_2/H_2O$ | $N_2/H_2O$ | No staining; copper extruded |
| 7 | Air/$H_2O$ | $N_2/H_2/H_2O$ | $N_2/H_2O$ | No staining |
| 8 | $N_2/H_2O$ | $N_2/H_2/H_2O$ | $N_2/H_2O$ | Dark gray; copper extruded |
| 9 | $N_2/O_2/H_2O$ | $N_2//H_2/H_2O$ | $N_2/H_2O$ | No staining; no extrusion |

$O_2 = 1\%$; $H_2 = 3\%$; $H_2O = 1.5\%$

Referring further to Table 2, it can be seen in Run. Nos. 6, 7 and 9, where burn-out atmosphere carried with it a quantity of oxygen, no staining was evident. Run No. 9 illustrates the presence of as little as 1% oxygen in a nitrogen and water vapor burn-out atmosphere, and yielded neither staining of the composite, nor extrusion of the copper.

It should be noted that the phenomenon of extrusion referred to in Table 2 occurs in the absence of oxygen, as ceramics or metals undergo uneven expansion and/or contraction, with the result that the metal is pushed or "extruded" out of the composite and a mechanical distortion of the product occurs. This phenomenon is undesirable and is generally attributable to the uneven shrinkage characteristics of the components of the composite.

This invention may be embodied in other forms or carried out in other ways without departing from the spirit or essential characteristics thereof. The present disclosure is therefore to be considered as in all respects illustrative and not restrictive, the scope of the invention being indicated by the appended Claims, and all changes which come within the meaning and range of equivalency are intended to be embraced therein.

What is claimed is:

1. In a method for heat processing a multilayered ceramic article prepared from a plurality of ceramic sheets including a volatilizable organic binder and having an internal conductor element defined by a pattern prepared from a printing composition containing as at least part thereof copper, copper oxide or a mixture of copper oxide and copper which promotes staining of the ceramic article by metallic inclusions, said method comprising:
   a. heating the article in an oxidizing atmosphere to completely remove the organic binder;
   b. further heating the article of Step a. in a reducing atmosphere to reduce copper oxide; and
   c. finally heating the article of Step b. in an essentially inert atmosphere to sinter the ceramic;
   d. the improvement including adding moisture to at least the essentially inert atmosphere of Step c. so that it includes an amount of the moisture from about 0.5% to about 3.0% $H_2O$ by volume to prevent the staining of the ceramic article by metallic inclusions.

2. The method of claim 1 wherein said moisture is present in Steps a. and c.

3. The method of claim 2 wherein Step a. is conducted with as little as 1% oxygen in said heating atmosphere.

4. The method of claim 1 wherein said moisture is present in Steps a., b. and c.

5. The method of claim 4 wherein Step a. is conducted with as little as 1% oxygen in said heating atmosphere.

6. The method of claim 1 wherein Steps a., b. and c. are performed consecutively without intermediate cool-down and warm-up steps.

7. The method of claim 1 wherein said moisture is generated by the catalytic reaction of hydrogen and oxygen.

8. The method of claim 1 wherein said organic binder is selected from the group consisting of cellulose derivatives, vinyl polymers and copolymers, and acrylic and-/or methacrylic acid and/or acid ester polymers and copolymers.

9. The method of claim 1 wherein the heating atmosphere for Step a. is an oxidizing atmosphere, the heating atmosphere for Step b. is a reducing atmosphere and the heating atmosphere for Step c. is a neutral atmosphere.

10. The method of claim 1 wherein in addition to the moisture recited therein, the atmosphere of Step a. contains from about 2% to about 20% oxygen; the atmosphere of Step b. contains from about 1% to about 10% hydrogen; and the atmosphere of Step c. contains essentially nitrogen.

11. The method of claim 1 wherein said moisture is present in a range of from about 1% to about 2%.

12. The method of claim 1 wherein Step a. is conducted at a temperature of up to about 500° C., Step b. is conducted at a temperature of up to about 485° C. and Step c. is conducted at a temperature of up to about 920° C.

13. The method of claim 1 wherein the performance of Steps a. to c. is completed in 24 hours or less.

14. The method of claim 1 wherein the atmosphere of Step a. contains from about 2% to about 5% of oxygen.

15. The method of claim 1 wherein the atmosphere of Step b. contains from about 1% to about 5% of hydrogen.

16. The method of claim 1 wherein said moisture is present in an amount of about 2% during Step c.

* * * * *